United States Patent
Leblon et al.

(10) Patent No.: US 9,745,930 B2
(45) Date of Patent: Aug. 29, 2017

(54) METHOD AND DEVICE FOR REPOLARIZING A PIEZOELECTRIC ACTUATOR OF AN INJECTOR OF AN INTERNAL COMBUSTION ENGINE OF A USED VEHICLE

(71) Applicants: Michael Leblon, Bressols (FR); Alain Atanasyan, Brax (FR); Yves Agnus, Toulouse (FR)

(72) Inventors: Michael Leblon, Bressols (FR); Alain Atanasyan, Brax (FR); Yves Agnus, Toulouse (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 404 days.

(21) Appl. No.: 14/445,580

(22) Filed: Jul. 29, 2014

(65) Prior Publication Data
US 2015/0026940 A1 Jan. 29, 2015

(30) Foreign Application Priority Data
Jul. 29, 2013 (FR) ...................................... 13 57478

(51) Int. Cl.
*F02M 51/06* (2006.01)
*F02D 41/20* (2006.01)
*H01L 41/257* (2013.01)

(52) U.S. Cl.
CPC ..... *F02M 51/0603* (2013.01); *F02D 41/2096* (2013.01); *H01L 41/257* (2013.01); *F02D 2200/0602* (2013.01); *Y10T 29/42* (2015.01)

(58) Field of Classification Search
CPC .............. F02M 51/063; F02D 41/2096; F02D 2200/0602; H01L 41/257; Y10T 29/42
See application file for complete search history.

(56) References Cited

U.S. PATENT DOCUMENTS

| 4,705,003 A | 11/1987 | Sakakibara et al. |
| 2006/0012265 A1 | 1/2006 | Bachmaier et al. |

(Continued)

FOREIGN PATENT DOCUMENTS

| CN | 102102609 A | 6/2011 |
| DE | 100 28 335 A1 | 2/2002 |

(Continued)

OTHER PUBLICATIONS

Machine Translation of FR Search Report, obtained Oct. 1, 2016.*
FR Search Report, dated Apr. 3, 2014, corresponding from FR application.

*Primary Examiner* — Livius R Cazan
(74) *Attorney, Agent, or Firm* — Young & Thompson

(57) ABSTRACT

A method for repolarizing a piezoelectric actuator associated with an injector mounted on an internal combustion engine of a vehicle, the piezoelectric actuator having undergone initial polarization before the vehicle was used, includes with the engine stopped:
applying a first polarization voltage to the terminals of the piezoelectric actuator during a first specified time interval of not less than ten minutes,
stopping the application of the first polarization voltage during a second time interval, following the first time interval and at least equal to the latter,
applying a second polarization voltage to the terminals of the piezoelectric actuator during a third specified time interval, following the second time interval,
stopping the application of the second polarization voltage to the terminals of the piezoelectric actuator after the third time interval,
the successive first, second and third time intervals defining a repolarization sequence of the piezoelectric actuator.

18 Claims, 2 Drawing Sheets

(56) References Cited

U.S. PATENT DOCUMENTS

| | | | |
|---|---|---|---|
| 2008/0265715 A1 | 10/2008 | Dollgast et al. | |
| 2010/0186718 A1* | 7/2010 | Klein | F02D 41/2096 123/472 |
| 2010/0325854 A1 | 12/2010 | Reichinger | |
| 2014/0340001 A1* | 11/2014 | Jung | F02D 41/2096 318/116 |

FOREIGN PATENT DOCUMENTS

| | | |
|---|---|---|
| DE | 10 2004 018211 A1 | 11/2005 |
| DE | 102004021955 A1 | 12/2005 |
| DE | 10 2004 046080 A1 | 4/2006 |
| DE | 10 2007 047657 B3 | 4/2009 |
| DE | 10 2007 059111 A1 | 6/2009 |
| DE | 10 2010 021448 A1 | 12/2011 |
| EP | 2 339 157 A1 | 6/2001 |
| EP | 1 138 910 A1 | 10/2001 |
| EP | 1 445 459 A1 | 8/2004 |
| FR | 2 919 972 A1 | 2/2009 |
| FR | 2 990 998 A1 | 11/2013 |
| GB | 2 451 754 A | 2/2009 |
| WO | 04/001794 A2 | 12/2003 |
| WO | 2004/040112 A1 | 5/2004 |
| WO | 2005/081332 A1 | 9/2005 |
| WO | 2009/106410 A1 | 9/2009 |
| WO | 2010/097330 A1 | 9/2010 |

* cited by examiner

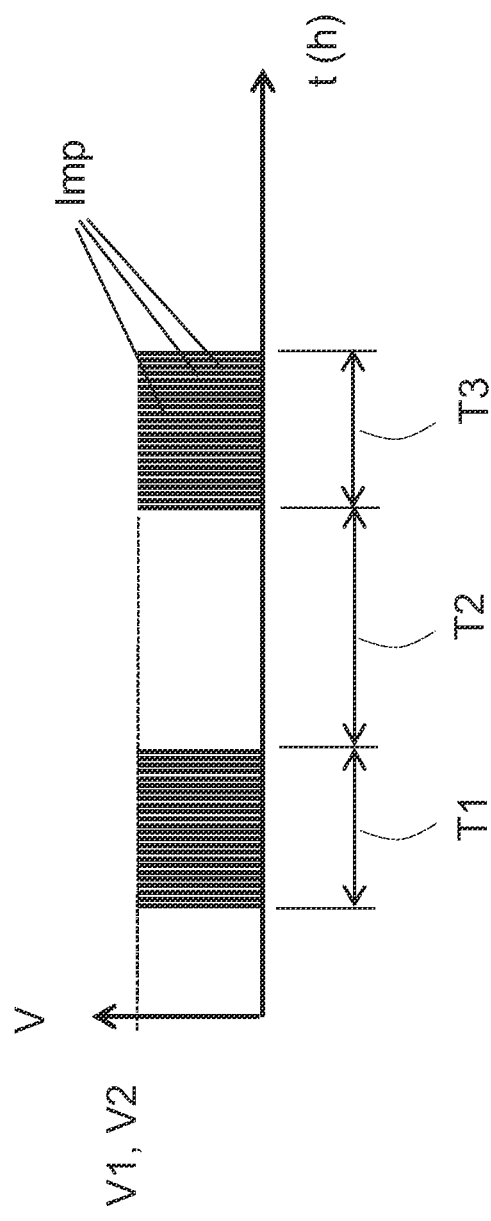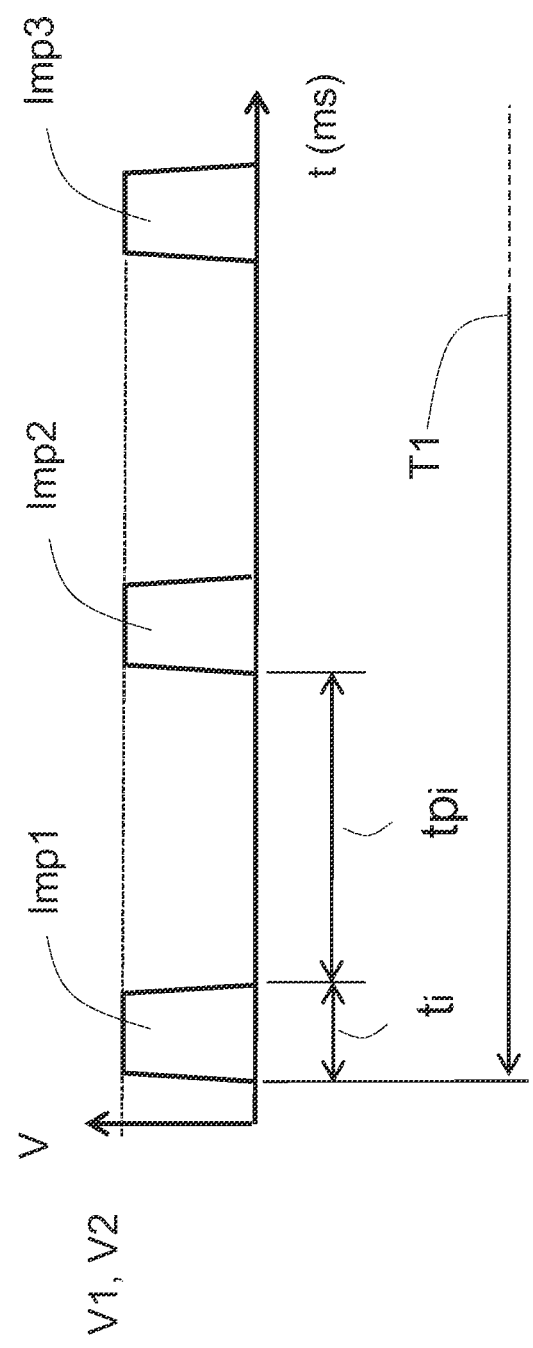

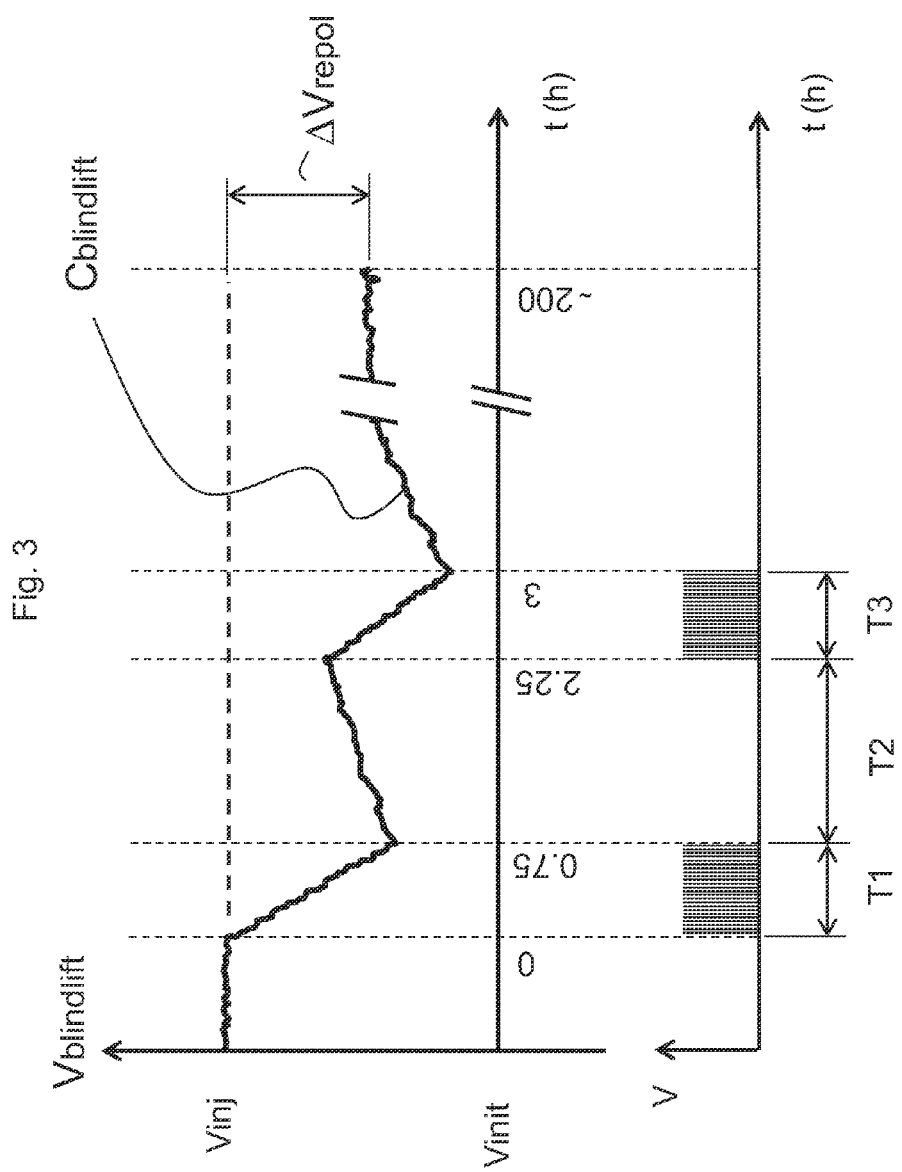

METHOD AND DEVICE FOR REPOLARIZING A PIEZOELECTRIC ACTUATOR OF AN INJECTOR OF AN INTERNAL COMBUSTION ENGINE OF A USED VEHICLE

FIELD OF THE INVENTION

The present invention relates to a method and a device for repolarizing a piezoelectric actuator of an injector of an internal combustion engine of a used vehicle, said piezoelectric actuator having undergone initial polarization before the vehicle was put into use.

BACKGROUND OF THE INVENTION

There is a known way of using a piezoelectric actuator to control the opening and closing of an injector in an internal combustion engine running on a fuel such as petrol or diesel oil.

A piezoelectric actuator is mainly composed, in a known way, of a stack of ceramic elements defining a specified length, which has the property of having its length modified by the action of an electric field, and, conversely, of producing an electric field under the action of a mechanical stress; this stack is placed in an injector between a stop and the valve means, and operates, in summary, in the following manner: when an electrical charge is applied, by means of a voltage, to the piezoelectric actuator, its length increases and opens the valve means of the injector which releases fuel under pressure into the combustion chamber. At rest, that is to say in a closed position of the valve means, there is a clearance between the piezoelectric actuator and the valve means, in order to enable this valve means to be closed and to prevent uncontrolled leaks of fuel towards the combustion chamber.

In order to be stable and have reproducible behaviour, a piezoelectric actuator must be polarized at a reference value, this being done in the factory during the manufacture of said actuator, and before the engine is put into use in a vehicle. This polarization, called the initial polarization, consists in applying an electrical charge by means of a specified voltage, called the polarization voltage, for a period which is also specified, across the terminals of the piezoelectric actuator, thereby causing the crystal structure of the latter to be orientated in the direction of the electric field established in the piezoelectric stack, corresponding to the direction in which the variation of the dimension of the piezoelectric actuator is desired. After the removal of this initial polarization voltage at the terminals of the piezoelectric stack, this stack retains a residual polarization state for its subsequent use.

However, a piezoelectric actuator tends to lose this initial polarization during its use in an internal combustion engine, notably because of the essentially urban use of the vehicle, resulting in low engine speeds and therefore low nominal voltages, considerably below the polarization voltage, for operating the injectors under low fuel pressure. In fact, the nominal supply or operating voltage applied to a piezoelectric actuator to open an injector is adjusted as a function of the requested torque and the engine speed. In particular, it is adjusted, where appropriate, as a function of the fuel pressure which is opposed to the opening of the valve means of the injector, and more generally to the energy required to open the valve means of the injector.

It should be noted that injectors, notably for internal combustion engines running on diesel fuel under high pressure, are preferably designed so that the fuel pressure is used in such a way that it is applied, in the closed position of the injector, from the side of the valve means which keeps the latter in a position in which it bears on its seat.

Other conditions of use, such as repeated cycles of increase and/or decrease in the engine temperature, or long periods without the use of the piezoelectric actuator, corresponding to prolonged periods of immobilization of the vehicle, may also lead to a change in the polarization of the piezoelectric actuator over time.

The depolarization, or drift, causes a contraction of the stack of ceramic elements of the piezoelectric actuator, and a consequent increase in the clearance between the piezoelectric actuator and the valve means. The increase in this clearance results in less precise control of the actuator, which may even lead to the loss of one or more injections of small amounts of fuel, for example what are known as pilot injections, since the injector no longer has time to compensate for the clearance and open the valve for brief time intervals, causing increased engine noise (the main injection combustion takes place with a high pressure gradient owing to the lack of a pilot injection) and pollution, as well as making driving disagreeable. For longer periods of opening of the injector, the drift of the piezoelectric actuator leads to poor control of the amount of fuel actually injected into the combustion chamber.

Furthermore, it is no longer possible to perform a new initial polarization on a previously polarized piezoelectric actuator, since the actuator undergoes processing after the initial polarization in which it is covered with an insulating protective coating and mounted in the injector housing. This it is no longer possible to perform this initial polarization procedure which, in most cases, requires the application of stresses to the stack of piezoelectric ceramic layers and a high temperature of more than 100° C.

However, there are methods of compensating for the depolarization of a piezoelectric actuator with the aim of polarizing the actuator again after the initial polarization applied when the product left the factory, these methods being more or less effective and costly, and generally requiring the dismounting of the injector. In many cases, the piezoelectric actuator, or even the whole injector, is replaced when the depolarization is too great and can no longer be compensated effectively.

The present applicant has proposed, in French patent application FR 1254719 of 23 May 2012, a control method for a piezoelectric actuator of a fuel injector of an internal combustion engine of a vehicle, comprising a step of applying a polarization charge to the actuator during the use of the engine and during fuel injection.

The applicant has continued his research and now proposes a repolarization method which can be used on a one-off basis with the engine stopped, with a minimum of intervention on the vehicle, and which is intended to overcome the aforementioned drawbacks, to some extent at least, and to rapidly improve the performance of a piezoelectrically operated injector which has become depolarized.

SUMMARY OF THE INVENTION

More precisely, the invention consists in a method for repolarizing a piezoelectric actuator of an injector of an internal combustion engine of a used vehicle, said piezoelectric actuator having undergone initial polarization before the vehicle was put into use, characterized in that the method comprises the following steps, the piezoelectric actuator being associated with the injector, and the latter being mounted on the engine, the engine being stopped:

ensuring that the residual injector fuel supply pressure is less than a specified threshold below which no injection of fuel into the combustion chamber can take place, applying a first polarization voltage to the terminals of the piezoelectric actuator during a first specified time interval of not less than ten minutes, stopping the application of the first polarization voltage during a second time interval, following the first time interval and at least equal to the latter, thus defining a pause time in which no voltage is applied to the actuator terminals, applying a second polarization voltage to the terminals of the piezoelectric actuator during a third specified time interval, following the second time interval, stopping the application of the second polarization voltage to the terminals of the piezoelectric actuator after the third time interval, said successive first, second and third time intervals defining a repolarization sequence of the piezoelectric actuator.

The method according to the invention may advantageously be used during a maintenance operation on the vehicle, in a service station for example, and can, in particular, obviate the need to replace an injector or injectors whose depolarization has become excessive. Advantageously, it can be used within less than half a day, for example. The method is used with the vehicle stationary and the engine switched off, and the operation can be carried out with the engine hot or at ambient temperature, which shortens the time required for the operation. The piezoelectric actuator is not under any stress, because it is free between a rear stop of the injector and the valve means of the latter. A single repolarization sequence according to the invention is normally sufficient to restore, at least partially, the polarization of a piezoelectric actuator so that the actuator correctly performs its functions of opening and closing the injector needle within time intervals compatible with the injection map implemented in the engine control unit, but more than one sequence may be provided if necessary. The repolarization sequence according to the invention enables the actuator to be repolarized and makes this repolarization robust over time, regardless of the use of the vehicle. The minimum duration of ten minutes for the first specified time interval represents a duration below which the repolarization is not sufficiently significant at the end of the application of the complete method according to the invention. The term "following" is to be interpreted here in the sense of "coming immediately after" or "immediately succeeding" in time, as a synonym of "immediately subsequent" or "consecutive".

According to an advantageous characteristic, the pause time is between one and three times the first or the third time interval.

The pause time in the sequence is important and ensures the robustness of the repolarization.

According to an advantageous characteristic, the first time interval is in the range from 30 to 45 minutes.

This period for the application of the first polarization voltage is defined as the best compromise between a shorter period which would create insufficient polarization, and a longer period for which the gain in polarization would be insignificant. This first period may be completed at ambient temperature or with the engine hot. "Ambient temperature" is to be interpreted as meaning the temperature of a cold engine.

According to an advantageous characteristic, the third time interval is equal or approximately equal to the first time interval.

This period further increases the polarization of the piezoelectric actuator.

According to an advantageous characteristic, the first polarization voltage and the second polarization voltage are about 160 volts each.

According to an advantageous characteristic, the first and second polarization voltages are applied by means of the vehicle battery, via a voltage step-up means, said method further comprising a step of ensuring that the voltage of said battery is above a predetermined voltage threshold before the first voltage is applied to the terminals of the piezoelectric actuator during the first specified time interval.

A polarization voltage, of about 160 volts for example, may advantageously be obtained by means of the vehicle battery, via a voltage step-up device, for example a continuous-continuous or DC-DC (standing for "Direct Current—Direct Current" in English) voltage converter, also called a DC-DC chopper. Thus, the method according to the invention can be applied by using the energy supplied by the vehicle itself, for example by means of software implemented in an external stand-alone tool, which uses the engine control unit of the vehicle by connecting to the diagnostic port of the unit to apply the polarization voltage sequence, according to the invention, to the piezoelectric actuators of the vehicle's fuel injectors.

According to an advantageous characteristic, the time interval for the application of the first or second polarization voltage comprises a cycle of successive voltage pulses, each of said electrical pulses having a duration in the range from 5 milliseconds to several seconds, preferably from 10 to 100 milliseconds.

Thus the applied voltage pulses have a high duration by comparison with the mean injector opening time, that is to say the mean activation time of the piezoelectric actuator in the context of its operation as an injector actuator, which is equal to several hundred microseconds.

According to an advantageous characteristic, the first polarization voltage, the pause time, and the second polarization voltage are respectively applied to all the piezoelectric actuators of the engine.

According to an advantageous characteristic, the method according to the invention consists, during the first or third time interval, in applying said successive voltage pulses to all the piezoelectric actuators of the engine, so that the successive voltage pulses applied to a given injector are separated by a rest time corresponding to the application time of the successive voltage pulses to each of the other piezoelectric actuators.

The present invention also relates to a device for repolarizing a piezoelectric actuator of an injector of an internal combustion engine of a used vehicle, said piezoelectric actuator having undergone initial polarization before the vehicle was put into use, the piezoelectric actuator being associated with the injector, the latter being mounted on the engine, and the engine being stopped and having an engine control unit, the device being characterized in that it comprises:

said engine control unit of the vehicle, an electrical power supply of the vehicle comprising a battery and a voltage step-up device, and means for executing the method according to the invention.

The device may take the form of a diagnostic box adapted to activate the engine control unit of the vehicle and to act on it so as to control the engine injectors for the purpose of applying the method according to the invention with the engine stopped, while making use, advantageously but not necessarily, of the vehicle's own energy, after checking that there is a sufficient energy reserve available in the battery for the application of said method without preventing the subsequent operation of the vehicle, particularly its starting. The means for executing the method according to the invention may advantageously comprise software implemented in the device.

BRIEF DESCRIPTION OF THE DRAWINGS

Other characteristics will become apparent from the following description of an embodiment of a repolarization method according to the invention, accompanied by the attached drawings, this example being provided for illustrative purposes and without limiting intent.

FIG. 1 shows a general schematic diagram of an exemplary embodiment of a repolarization method according to the invention, applied to a piezoelectric actuator of a fuel injector.

FIG. 2 shows schematically an enlarged detail of FIG. 1.

FIG. 3 shows schematically a curve representing the variation in time of the clearance between the piezoelectric actuator and the valve means of the injector, throughout the example of application of the method according to FIGS. 1 and 2.

DETAILED DESCRIPTION OF THE INVENTION

The repolarization method shown in FIGS. 1 to 3 is applied to a piezoelectric actuator of an injector of an internal combustion engine of a used vehicle (not shown), the piezoelectric actuator having undergone initial polarization before the vehicle was put into use. During the application of the method as described, the piezoelectric actuator is associated with the injector, according to the original mounting, the injector being mounted on the engine, and the engine being stopped. The injector is therefore in its original mounting on the vehicle. The method as described does not require the dismounting of the actuator or the injector. It can advantageously be used in a service station during the servicing of the vehicle.

In FIGS. 1 and 2, the time t for the execution of the method as described is shown on the horizontal axis, while the voltage V applied to the terminals of the piezoelectric actuator is shown on the vertical axis.

The method according to FIGS. 1 to 3 comprises the following steps:
ensuring that the residual pressure, for example in the common fuel supply rail of the injector (not shown), is less than a specified threshold below which no injection of fuel into the combustion chamber can take place, because the polarization voltage applied to the injector's piezoelectric actuator creates a pressure of the actuator on the injector valve means, thereby opening the latter,
applying a first polarization voltage V1 to the terminals of the piezoelectric actuator during a first specified time interval T1 or a first active time interval T1 which must be not less than ten minutes, as shown in FIG. 1,
stopping the application of the first polarization voltage V1 during a second time interval T2, following the first time interval T1, and at least equal to the latter, thus defining a pause time in which no voltage is applied to the actuator terminals, as shown in FIG. 1,
applying a second polarization voltage V2 to the terminals of the piezoelectric actuator during a third specified time interval T3, or second active time interval, following the second time interval T2, as shown in FIG. 1,
stopping the application of the second polarization voltage V2 to the terminals of the piezoelectric actuator after the third time interval T3, as shown in FIG. 1.

The first T1, second T2 and third T3 successive time intervals, in combination, define an advantageously complete repolarization sequence of the piezoelectric actuator.

The fuel supply pressure threshold above which the method as described must not be applied can be measured by means of the fuel supply pressure sensor which is generally present in a common fuel supply rail of the injectors of the engine. This threshold depends on the injectors, and is generally considered equal to approximately 100 bars, representing the minimum mean pressure for the opening of an injector with a piezoelectric actuator. Preferably, this threshold is set at about 20 bars, ensuring that there is absolutely no opening of the injector during the application of the polarization voltage.

The first active time interval T1 is preferably in the range from 30 to 45 minutes, and preferably close to or equal to 45 minutes.

The second time interval T2, or pause time, is preferably between one and three times, preferably equal or approximately equal to twice, the first T1 or the third T3 time interval.

The third time interval T3, or second active time interval, is preferably equal or approximately equal to the first time interval T1.

The first polarization voltage V1 and the second polarization voltage V2 are preferably in the range from 140 to 180 volts, preferably about 160 volts each.

Preferably, the first V1 and second V2 polarization voltages are applied by means of the vehicle battery (not shown) via a voltage step-up means, for example the DC-DC voltage converter of a known type generally fitted to heat engine vehicles having a low-voltage battery and piezoelectrically operated injectors. In this case, the method as described further comprises a step of ensuring that the voltage of the vehicle battery is above a predetermined voltage threshold before the first polarization voltage V1 is applied to the terminals of the piezoelectric actuator during the first specified time interval T1. This step can be carried out simultaneously with, before, or after the step of checking the residual fuel pressure. A minimum voltage threshold in the range from 10 to 12 volts, preferably from 11 to 12 volts, is appropriate, given that the energy drawn from the DC-DC converter for the application of the repolarization method as described is relatively low, being approximately several millijoules. Should it be impossible to reach the minimum voltage threshold, it would be preferable not to use the energy of the vehicle battery to apply the method, in order to avoid any problems in using the electric starter immediately after the application of the repolarization method where this is necessary. In such a case, the method as described may be applied using an external voltage source.

As shown in FIG. 2, in which the horizontal axis showing the values of time has been enlarged, the time interval T1 or T2, for the application of the first V1 or second V2 polarization voltage respectively, advantageously comprises a cycle of successive voltage pulses Imp, for example Imp1, Imp2, Imp3, as shown in FIG. 2, each of said electrical pulses Imp preferably having a duration $t_i$ in the range from 5 milliseconds to several seconds, preferably from 10 to 100 milliseconds.

In FIG. 1, the application of a polarization voltage V1 or V2 during the time intervals T1 or T2 respectively is represented by a plurality of vertical lines which, in the example, simulate the voltage pulses Imp represented partially and in an enlarged fashion in FIG. 2 by the pulse curves Imp1, Imp2, and Imp3. Between two successive pulses Imp, a rest time $tp_i$ is shown in FIG. 2. In the example, this rest time $tp_i$ corresponds to the time interval for the application of a polarization voltage pulse Imp1, Imp2, . . . to each of the other piezoelectric actuators of the engine. In the illustrated example, for an engine with four injectors, the time interval $tp_i$ is equal or approximately equal to three times the time interval $t_i$, so that all four injectors are repolarized. Thus all the piezoelectric actuators of the engine are advantageously repolarized in parallel. In other words, the first polarization voltage V1, the pause time T2, and the second polarization voltage V2 are respectively applied to all the piezoelectric actuators of the engine. During the time interval T1, the first voltage V1 is applied in successive pulses to each of the piezoelectric actuators of the engines alternately. The second voltage V2 is applied in the same way during the time interval T3. During the pause time T2, no actuator receives a voltage. Thus, during the first T1 or third T3 time interval, the successive voltage pulses Imp are applied to all the piezoelectric actuators of the engine, so that the successive voltage pulses Imp1, Imp2, Imp3 applied to a given actuator are separated by a rest time $tp_i$ corresponding to the time interval for the application of the corresponding successive voltage pulses to each of the other piezoelectric actuators.

In FIG. 3, the time during which the method described above is executed is shown on the horizontal axis, and a parameter representing the clearance of the injector between its piezoelectric actuator undergoing repolarization and its valve means, namely the voltage $V_{Blindlift}$, is shown on the vertical axis. This voltage $Vg_{Blindlift}$ corresponds to a reference voltage which is to be applied to the terminals of the piezoelectric actuator in certain conditions to take up said clearance of the injector. As the injector clearance increases, the voltage $V_{Blindlift}$ becomes higher. Therefore, the curve $C_{Blindlift}$ shows the variation of this clearance throughout the repolarization method as described. Below the horizontal axis of this curve $C_{Blindlift}$, the schematic diagram of FIG. 1 is shown in a synchronized manner so as to correlate the application of the repolarization method with the results achieved on the piezoelectric actuator.

The horizontal (time) axis of FIG. 3 meets the vertical axis at the level of the voltage $V_{init}$ corresponding to the initial polarization of the injector. The injector present at the start of the method exhibits a voltage level $V_{inj}$ corresponding to an excessively large clearance of the injector. The repolarization method as described above is applied, starting at the instant t=0 on the horizontal axis. It can be seen that the voltage $V_{init}$ of the initial polarization is never reached during the method as described. Therefore, the method according to the injection cannot be used to restore the initial polarization of the piezoelectric actuator. However, it can be used to restore sufficient polarization to enable the injector to perform its intended functions again. In fact, at the end of the method, in other words at the end of the time interval T3 at t=3 hours on the horizontal axis, more than 75% of the lost polarization has been restored in the injector. After a period of just under 200 hours or thereabouts after the application of the method according to the invention, approximately half of the lost initial polarization ($V_{inj}-V_{init}$) is retained in the piezoelectric actuator. This half is represented by the distance $\Delta V_{repol}$ in FIG. 3. This represents a sufficient repolarization for the correct operation of the injector.

In greater detail, FIG. 3 shows that the injector clearance decreases markedly during the time interval T1, then increases during the pause time T2 in a approximately regular manner, until the second polarization voltage is applied during the time interval T3, in the course of which the injector clearance falls below the level reached at the end of the application of the first voltage during the time interval T1. After the application of the first polarization voltage during the time interval T1, it is found that the acquired polarization is not stable, since it is lost in a regular or approximately regular manner during the pause time. After the application of the second polarization voltage during the third time interval T3, it is found that the acquired polarization is stabilized after several hours, after a partial loss of polarization immediately after the end of the third time interval T3.

It should be noted that the number of active cycles of application of the polarization voltage, i.e. the first time interval T1 and the third time interval T3 in the example, can be increased, with a pause time, i.e. the second time interval T2 in the example, always provided between two successive active cycles, this pause time being at least equal to the duration of one of the active cycles of application of the polarization voltage.

An example of a device for repolarizing a piezoelectric actuator of an injector of an internal combustion engine of a used vehicle, the piezoelectric actuator having undergone initial polarization before the vehicle was put into use, the piezoelectric actuator being associated with the injector, the latter being mounted on the engine, and the vehicle being stopped and having an engine control unit, this device permitting the execution of a method as described above with the aid of FIGS. 1 to 3, advantageously comprises:

the engine control unit of the vehicle, an electrical power supply of the vehicle, comprising a battery and a voltage step-up device, for example the DC-DC voltage converter of the vehicle, software which is implemented in an electronic maintenance box which includes means of electrical connection to the engine control unit, via the diagnostic port of the latter for example, and which enables the engine control unit to be activated and controlled for the purpose of applying the steps of the method as described above.

The invention claimed is:

1. A method for repolarizing a piezoelectric actuator of an injector of an internal combustion engine of a used vehicle, said piezoelectric actuator having undergone initial polarization before the vehicle was put into use, characterized in that the method comprises the following steps, the piezoelectric actuator being associated with the injector, and the injector being mounted on the engine, the engine being stopped:

ensuring that a residual injector fuel supply pressure is less than a specified threshold below which no injection of fuel into the combustion chamber can take place;

applying a first polarization voltage (V1) to the terminals of the piezoelectric actuator during a first specified time interval (T1) of not less than ten minutes;

stopping the application of the first polarization voltage (V1) during a second time interval (T2), following the first time interval (T1) and at least equal to the latter, thus defining a pause time in which no voltage is applied to the actuator terminals;

applying a second polarization voltage (V2) to the terminals of the piezoelectric actuator during a third specified time interval (T3), following the second time interval; and stopping the application of the second polarization voltage (V2) to the terminals of the piezoelectric actuator after the third time interval (T3), said first (T1), second (T2) and third (T3) successive time intervals, in combination, defining a repolarization sequence of the piezoelectric actuator.

2. The method according to claim 1, wherein the pause time is between one and three times the first (T1) or the third (T3) time interval.

3. The method according to claim 2, wherein the first time interval (T1) is in the range from 30 to 45 minutes.

4. The method according to claim 2, wherein the third time interval (T3) is equal or approximately equal to the first time interval (T1).

5. The method according to claim 2, wherein the first polarization voltage (V1) and the second polarization voltage (V2) are about 160 volts each.

6. The method according to claim 2, wherein the first (V1) and second (V2) polarization voltages are applied by means of the vehicle battery, via a voltage step-up means, said method further comprising a step of ensuring that the voltage of said battery is above a predetermined voltage threshold before the first voltage (V1) is applied to the terminals of the piezoelectric actuator during the first specified time interval (T1).

7. The method according to claim 2, wherein the time interval for the application of the first (V1) or second (V2) polarization voltage comprises a cycle of successive voltage pulses (Imp), each of said electrical pulses having a duration ($t_i$) in the range from 5 milliseconds to several seconds.

8. The method according to claim 7, wherein each of said electrical pulses has a duration ($t_i$) in the range from 10 to 100 milliseconds.

9. The method according to claim 2, characterized in that the first polarization voltage (V1), the pause time, and the second polarization voltage (V2) are respectively applied to all the piezoelectric actuators of the engine.

10. The method according to claim 1, wherein the first time interval (T1) is in the range from 30 to 45 minutes.

11. The method according to claim 1, wherein the third time interval (T3) is equal or approximately equal to the first time interval (T1).

12. The method according to claim 1, wherein the first polarization voltage (V1) and the second polarization voltage (V2) are about 160 volts each.

13. The method according to claim 1, wherein the first (V1) and second (V2) polarization voltages are applied by means of the vehicle battery, via a voltage step-up means, said method further comprising a step of ensuring that the voltage of said battery is above a predetermined voltage threshold before the first voltage (V1) is applied to the terminals of the piezoelectric actuator during the first specified time interval (T1).

14. The method according to claim 1, wherein the time interval for the application of the first (V1) or second (V2) polarization voltage comprises a cycle of successive voltage pulses (Imp), each of said electrical pulses having a duration ($t_i$) in the range from 5 milliseconds to several seconds.

15. The method according to claim 14, characterized in that it consists, during the first (T1) or third (T3) time interval, in applying said successive voltage pulses to all the piezoelectric actuators of the engine, so that the successive voltage pulses (Imp) applied to a given injector are separated by a rest time ($tp_i$) corresponding to the application time of the successive voltage pulses to each of the other piezoelectric actuators.

16. The method according to claim 14, wherein each of said electrical pulses has a duration ($t_i$) in the range from 10 to 100 milliseconds.

17. The method according to claim 1, characterized in that the first polarization voltage (V1), the pause time, and the second polarization voltage (V2) are respectively applied to all the piezoelectric actuators of the engine.

18. A device for repolarizing a piezoelectric actuator of an injector of an internal combustion engine of a used vehicle, said piezoelectric actuator having undergone initial polarization before the vehicle was put into use, the piezoelectric actuator being associated with the injector, the engine being stopped, and the injector being mounted on the engine and in communication with an engine control unit of the engine, the device comprising:

an electronic maintenance box in electrical connection with the engine control unit, said electrical connection to the engine control unit being configured to enable the electronic maintenance box to activate and control the engine control unit, and said electronic maintenance box being configured to execute software, implemented in said electronic maintenance box that upon execution by the electronic maintenance box causes the engine control unit, via said electrical connection to the engine control unit to perform the functions of ensuring that a residual injector fuel supply pressure, via a fuel supply pressure sensor associated with the injector, is less than a specified threshold below which no injection of fuel into the combustion chamber can take place, applying a first polarization voltage (V1) to the terminals of the piezoelectric actuator during a first specified time interval (T1) of not less than ten minutes, stopping the application of the first polarization voltage (V1) during a second time interval (T2), following the first time interval (T1) and at least equal to the latter, thus defining a pause time in which no voltage is applied to the actuator terminals, applying a second polarization voltage (V2) to the terminals of the piezoelectric actuator during a third specified time interval (T3), following the second time interval, and stopping the application of the second polarization voltage (V2) to the terminals of the piezoelectric actuator after the third time interval (T3), said first (T1), second (T2) and third (T3) successive time intervals, in combination, defining a repolarization sequence of the piezoelectric actuator.

* * * * *